US009692442B1

(12) United States Patent
Kutz et al.

(10) Patent No.: US 9,692,442 B1
(45) Date of Patent: Jun. 27, 2017

(54) DIGITAL-TO-ANALOG CONVERTER WITH A SAMPLE AND HOLD CIRCUIT AND A CONTINUOUS-TIME PROGRAMMABLE BLOCK

(71) Applicant: Cypress Semiconductor Corporation, San Jose, CA (US)

(72) Inventors: Harold M. Kutz, Edmonds, WA (US); Erhan Hancioglu, Bothell, WA (US); Timothy John Williams, Bellevue, WA (US); Hans Klein, Pleasanton, CA (US); Eric N. Mann, Issaquah, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/387,337

(22) Filed: Dec. 21, 2016

Related U.S. Application Data

(60) Provisional application No. 62/402,275, filed on Sep. 30, 2016.

(51) Int. Cl.
*H03M 1/10* (2006.01)
*H03M 1/66* (2006.01)
*H03M 1/00* (2006.01)
*H03M 1/12* (2006.01)

(52) U.S. Cl.
CPC ........... *H03M 1/66* (2013.01); *H03M 1/1009* (2013.01); *H03M 1/00* (2013.01); *H03M 1/12* (2013.01)

(58) Field of Classification Search
CPC .................................. H03M 1/12; H03M 1/00
USPC ................................. 341/122, 120, 118, 119
See application file for complete search history.

(56) References Cited

U.S. PATENT DOCUMENTS

| | | | |
|---|---|---|---|
| 4,584,559 A | 4/1986 | Penney | |
| 6,124,814 A | 9/2000 | Lee et al. | |
| 6,271,784 B1 * | 8/2001 | Lynn | ................... H03M 1/0872 330/150 |
| 6,297,759 B1 | 10/2001 | Lewyn | |
| 6,304,199 B1 | 10/2001 | Fang et al. | |
| 8,570,200 B2 | 10/2013 | Ashburn et al. | |

OTHER PUBLICATIONS

Matthew Sauceda, "Sample & Hold Glitch Reduction for Precision Outputs Reference Design," Texas Instruments, Jul. 2015; 38 pages.

* cited by examiner

*Primary Examiner* — Joseph Lauture
(74) *Attorney, Agent, or Firm* — Lowenstein Sandler LLP

(57) ABSTRACT

A device, system, and method of a programmable circuit configured to operate in a buffered drive mode and blanking mode is disclosed. The programmable circuit includes a continuous-time digital-to-analog converter (CTDAC), a continuous-time block (CTB), coupled to the CTDAC, and a sample and hold (SH) circuit coupled to the CTDAC and the CTB. The programmable circuit is configured to operate in a buffered drive mode to buffer an output signal from the CTDAC. The programmable circuit, in buffered drive mode, is further configured to operate in a blanking mode to cause the SH circuit to perform a blanking operation on the CTDAC output signal.

20 Claims, 12 Drawing Sheets

DIGITAL-TO-ANALOG CONVERTER WITH A SAMPLE AND HOLD CIRCUIT AND A CONTINUOUS-TIME PROGRAMMABLE BLOCK

RELATED APPLICATIONS

This application claims the benefit of U.S. Provisional Application No. 62/402,275 filed on Sep. 30, 2016, the content of which is hereby incorporated by reference herein.

TECHNICAL FIELD

The disclosure relates to the field of electronic circuits, in particular to programmable circuits.

BACKGROUND

Electronic circuits may include individual electronic components, such as resistors, transistors, capacitors, inductors, and diodes, among others, connected by conductive wires or traces through which electric current can flow. Electronic circuit may be constructed using discrete components, or more commonly integrated in an integrated circuit where the components and interconnections are formed on a common substrate, such as silicon.

BRIEF DESCRIPTION OF THE DRAWINGS

The present invention is illustrated by way of example, and not of limitation, in the figures of the accompanying drawings.

DETAILED DESCRIPTION

Figure 1:
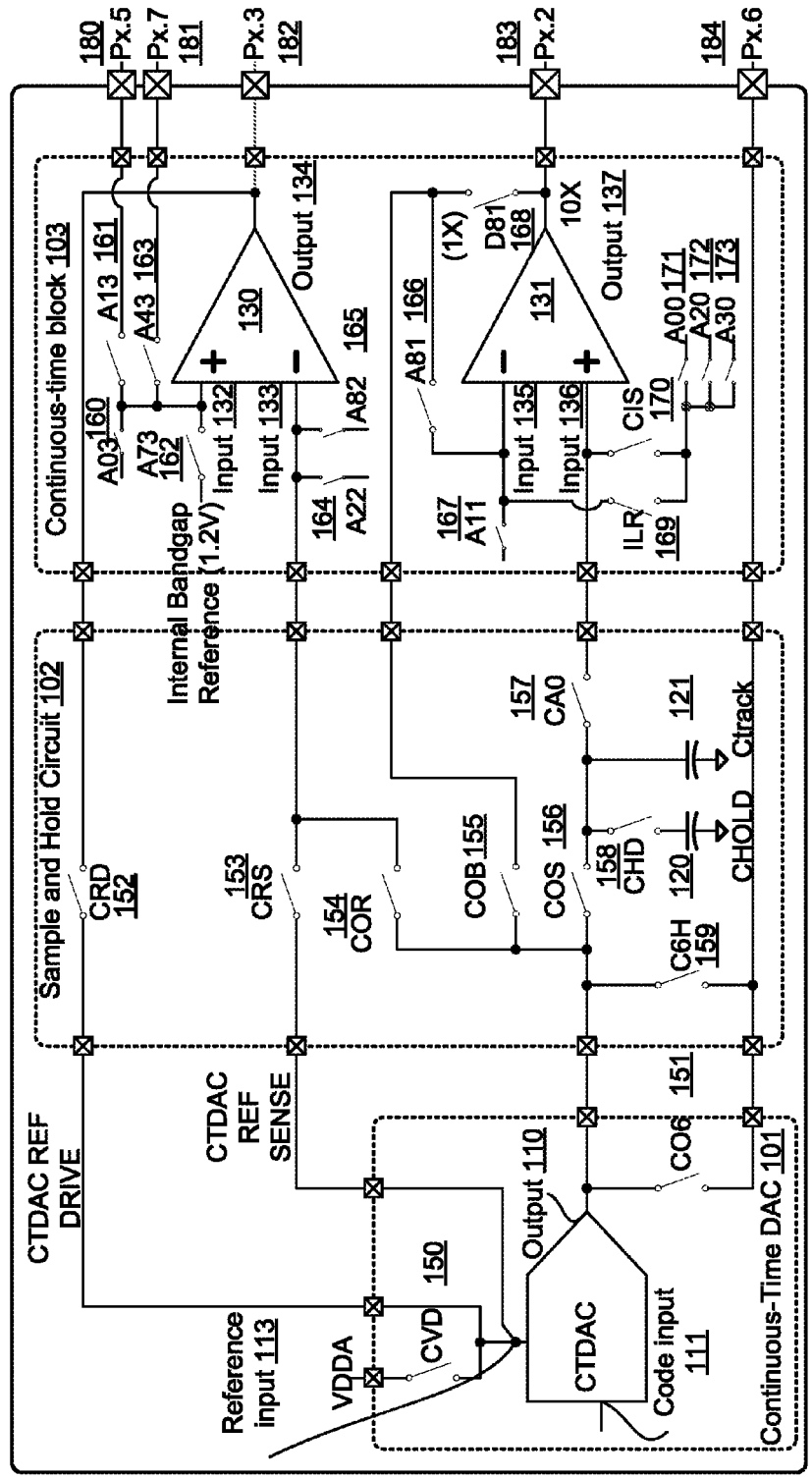
FIG. 1 is a circuit diagram illustrating a programmable circuit according to some implementations.

Apparatuses, systems, and methods of programmable circuits are described. A programmable circuit may be an electronic circuit, such as an integrated circuit (IC), that has multiple components that are reconfigurable to perform various operations or functions (also referred to as "modes" herein). Unlike fixed function circuits, programmable circuits may be programmed (e.g., configured or reconfigured) during operation (e.g., field-programmable) or prior to use to execute some functions and not execute other functions. In addition, a programmable circuit may be configured or reconfigured during operation based on the programming of the programmable circuit (e.g., run-time configurable). Programmable circuits may be reprogrammed multiple times to execute different operations and functions.

Application demand has increased the desire for programmable circuits with increased flexibility to support diverse applications. Rather than support some operations with off-chip components, designers are tasked with bringing functionality to programmable circuits to improve performance, cost, meet customer demands, and repurpose functional blocks to perform multiple functions.

Aspects of the present disclosure address the above-mentioned and other deficiencies by providing a programmable circuit with a continuous-time digital-to-analog converter (CTDAC), a continuous-time block (CTB), and sample and hold (SH) circuit. The programmable circuit may be configured to operate in different modes. In a buffered mode, the programmable circuit may buffer an output signal from the CTDAC. In the buffered mode, the programmable circuit may be further configured to operate in a blanking mode to cause the SH circuit to perform a blanking operation on the CTDAC output signal. The blanking operation may attenuate glitches on the CTDAC output signal resulting from a code transitions associated with the CTDAC.

Glitch (also referred to as "glitch impulse" herein) may refer to overshoot or undershoot of a desired or steady-state output of an electric signal, such as current signal or voltage signal. For example, an output of a digital-to-analog converter (DAC) may be desired to be 1 Volts (V). As a result of a code transition, the output of the DAC may have glitch and may swing from 1.2 V (e.g., overshoot) to 0.9 V (e.g., undershoot) before settling to the steady-state output of 1 V.

Code transition may refer to the input signal of a DAC changing from a first code (e.g., digital code, such as binary "0111") to another code (e.g., binary "1000"), where the changing input code (also referred to as "code" or "digital code" or "input code signal" herein) affects a change in the analog output signal of a DAC. For example, during a code transition, and in particular during a major-carry transition, the analog output signal of the DAC may have a glitch. Without blanking, the glitch may propagate to other circuits and cause errors.

In some implementations, the programmable circuit may be configured to operate in a programmable gain amplifier (PGA) mode to perform a gain operation on an input signal of the programmable circuit. In some implementations, the input signal is an external input signal that is supplied by a source external to the programmable circuit. In implementations, the gain may be controlled by controlling the input code of the CTDAC. It may be noted that the programmable circuit may be configured and re-configured, during or prior to operation, to operate in the different modes described herein. It also may be noted that the programmable circuit may concurrently operate in one or more modes described herein.

In still other implementations, the programmable circuit may be configured in a PGA mode to further perform automatic gain control (AGC) (also referred to as "auto gain control mode" herein) where the gain of the PGA is adjusted during operation of the programmable circuit based on a system's requirements.

FIG. 1 is a circuit diagram illustrating a programmable circuit according to some implementations. Programmable circuit 100 includes continuous-time digital-to-analog converter (CTDAC) 101, sample and hold (SH) circuit 102, and continuous-time block (CTB) 103. Programmable circuit 100 includes switches 150-173. In some implementations, switches 150-173 may be implemented using one or more metal-oxide-semiconductor (MOS) transistors. Switches 150-173 may be controlled by control logic (not shown). In some implementations, programmable circuit 100 may be a stand alone integrated circuit, or integrated in a larger integrated circuit, such as a System-on-Chip (SOC). In some implementations, one or more components of programmable circuit 100 may be implemented as discrete components. In some implementations, pins 180-184 illustrated connection pins of programmable circuit 100 may connect to off-chip components or signals supplied by off-chip components. In some implementations, where programmable circuit 100 is wholly or part of an IC, internal signals may be connected to components of programmable circuit 100 to improve functionality. Internal signal, as used herein, may refer to a signal internal to an IC where programmable circuit 100 is wholly or part of an IC, unless otherwise described. External signal, as used herein, may refer to a signal (e.g., off-chip signal) external to an IC where programmable circuit 100 is wholly or part of the IC, unless otherwise described. For example, amplifier 131 may connect to internal signals using switches 171, 172, or 173. Amplifier 130 may connect to external signals using pin 180 or pin 181. It may be noted that in implementations, programmable circuit 100 may include the same, greater, or fewer components as illustrated in FIG. 1.

In implementations, CTDAC 101 includes code input 111, reference input 113, and output 110. CTDAC 101 may receive a digital code at code input 111, and convert the digital code into an analog signal at output 110 of CTDAC 101. In implementations, CTDAC 101 may output a signal via output 110 in the continuous-time domain. In some implementations. CTDAC 101 is a continuous-time voltage digital-to-analog converter (DAC) that outputs a voltage signal in the continuous-time domain (rather than output a current signal to a resistor external to the CTDAC to create a voltage). For example, CTDAC 101 may receive a digital code at code input 111, and output at output 110 an analog voltage signal representative of the digital code.

In implementations, CTDAC 101 may be a DAC of any resolution such as 8-bit resolution, 10-bit resolution, or 12 bit-resolution, and so forth (e.g., odd-bit resolution). In implementations, CTDAC 101 is a resistor-based DAC, such as resistor-2-resistor (R-2R) DAC or segmented DAC. A segmented DAC may use a resistor-based DAC along with features of other architectures. For example, a segmented DAC with 12-bit resolution may be implemented with an R-2R array for 10-bits of the least significant bit (LSB) and a thermometer array for 2-bit of most significant bit (MSB). A segmented DAC, according to an implementation, is further described with respect to FIG. 8.

Figure 4:
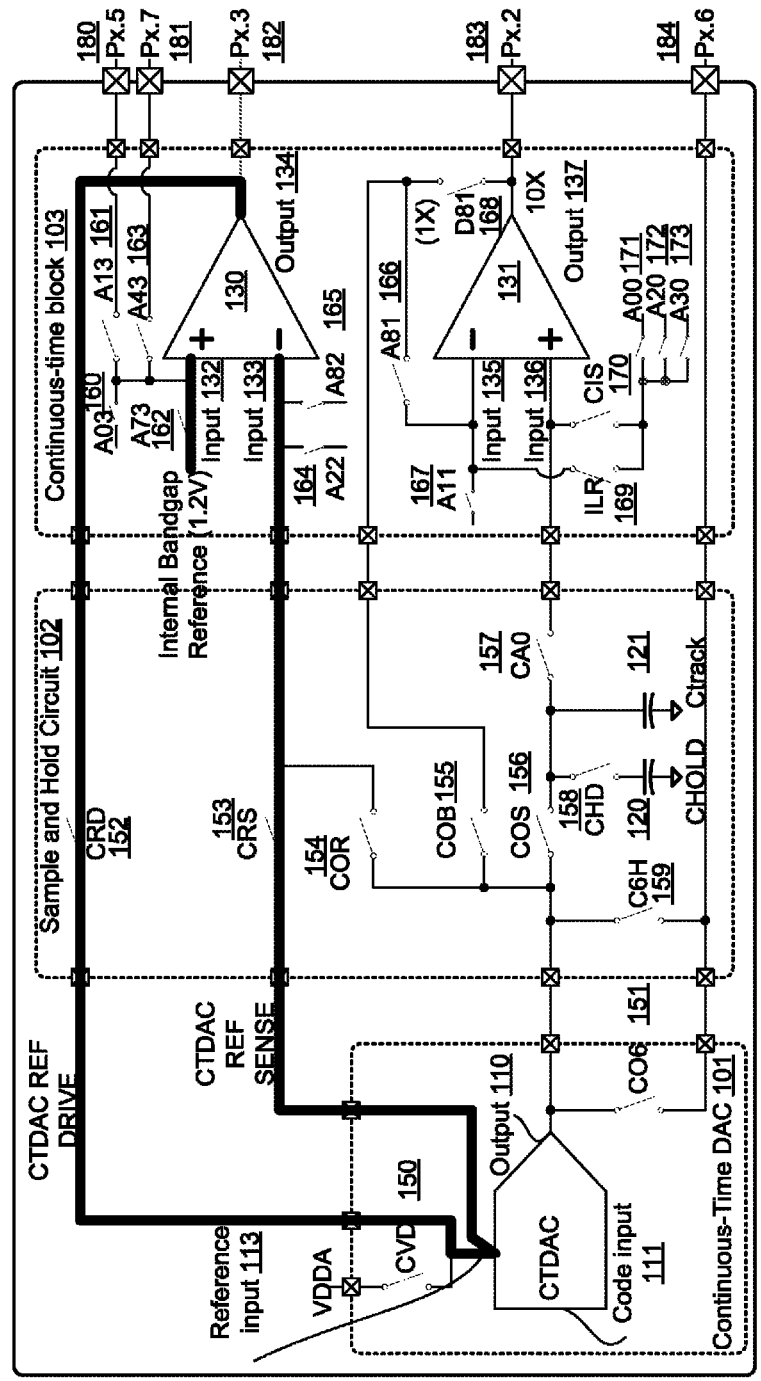
FIG. 4 is a circuit diagram illustrating a programmable circuit configurable with different reference signal modes, according to other implementations.

In implementations, programmable circuit 100 may be configured in different reference signal modes so that CTDAC 101 is configured to receive different reference signals (also referred to as "reference voltage" or "Vref" herein) at reference input 113, as further described with respect to FIG. 4.

Figure 5:
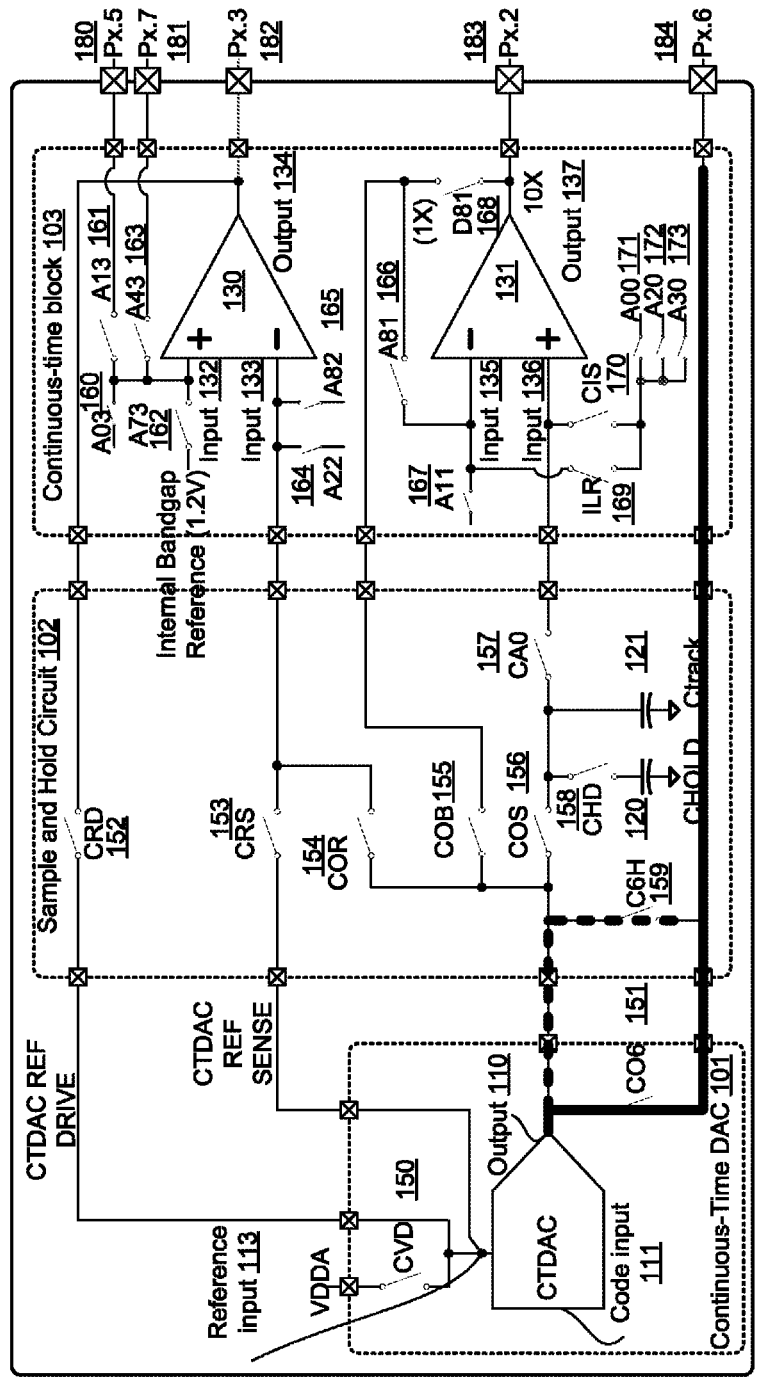
FIG. 5 is a circuit diagram illustrating a programmable circuit configured in a direct drive mode, according to other implementations.
Figure 6:
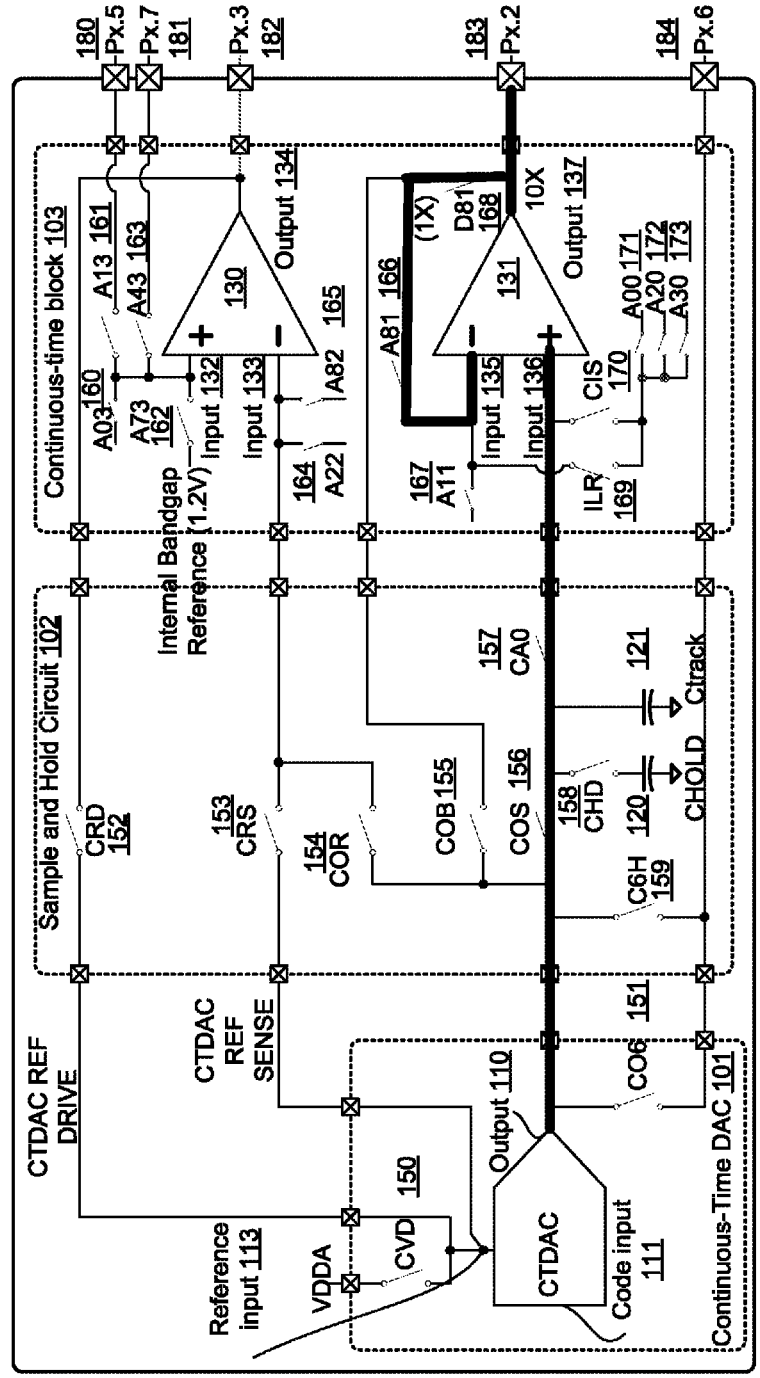
FIG. 6 is a circuit diagram illustrating a programmable circuit configured in a buffered drive mode, according to other implementations.

In other implementations, programmable circuit 100 may be configured with different drive modes (e.g., direct drive mode or buffered drive mode) so that output signal of CTDAC 101 via output 110 is driven with or without buffering, as further described with respect to FIG. 5 and FIG. 6.

In implementations, SH circuit 102 may include one or more capacitors to perform sample and hold operations, as well as other operations described herein. As illustrated, SH circuit 102 may include multiple switches, such as switches 152-159. In one implementation. SH circuit 102 implements two capacitors, capacitor 120 (Chold) and capacitor 121 (Ctrack). Capacitor 120 may be significantly larger (e.g., 10× or greater) than capacitor 121. Using two different sized capacitors may add greater flexibility in circuit operation. For example, the larger capacitor 120 may be used in a sample and hold mode to perform a sample and hold operation. The larger capacitor 120 may cause the sample and hold operation to run slower, but also may hold charge longer to better deal with leakage currents. In another example, a smaller capacitor 121 may be used in blanking mode to perform a blanking operation. The smaller capacitor 121 may allow CTDAC 101 to run faster and may be sufficiently sized to perform a blanking operation. It may be noted that the differently sized capacitors may be used in different manners in different modes, in addition to those described herein. Blanking mode may be further described with respect to FIG. 2A-2B. SH mode may be further described with respect to FIG. 7A-7B.

Continuous-time block (CTB) 103 may be implemented with one or more amplifiers, such as amplifier 130 or amplifier 131. In implementations, amplifier 130 or 131 may be an operational amplifier, such as a unity gain amplifier. In implementations, amplifier 130 or amplifier 131 may be a high gain bandwidth amplifier capable of rail-to-rail input and output ranges. In implementations, amplifier 130 or 131 may provide an output signal in the continuous-time domain. It may be noted that for purposes of illustration, rather than limitation, certain operations are described as being performed by amplifier 130 and other operations are described as being performed by amplifier 131. It may also be noted that amplifier 130 or amplifier 131 may be configured to perform any of the operations herein.

CTB 103 also includes switches 160-173. Amplifier 130 includes input 132 (positive), input 133 (negative), and output 134. Amplifier 131 includes input 135 (positive), input 136 (negative), and output 137. In implementations, programmable circuit 100 may be configured to operate in a programmable gain amplifier (PGA) mode so programmable circuit 100 operates as a programmable gain amplifier as further described with respect to FIG. 3A. In still other implementations, programmable circuit may operate in a programmable attenuator mode to perform programmable attenuation, as further described with respect to FIG. 3A. In still other implementations, programmable circuit 100 in programmable gain amplifier mode operates as a programmable gain amplifier with auto gain control (AGC), as further described with respect to FIG. 4. In implementations, it may be noted that the programmable circuit 100 may be programmed via firmware (or a firmware interface). Switches 150-173 of programmable circuit 100 may be controlled by firmware (implemented in a microcontroller (MCU) or processing core, for example) or control logic/state machines or register settings or a combination thereof.

In implementations, CTB 103 may include reconfigurable analog circuits for executing signal processing in a continuous time domain. In some implementations, CTB 103 may include amplifiers (e.g., operational amplifiers) reconfigurable into various analog circuits. CTB 103 may receive input signals from and/or provide output signals to external to programmable circuit 100 via input/output connections such as pins 180 through 184. In implementations, CTB 103 may receive input signals from and/or provide output signals to analog routing (not shown). In implementations, CTB 103 may be connected to a low resistance and/or low noise routing. In implementations, CTB 103 may receive high or low analog power supplies (e.g., VDDA), a switching power supply, as well as a block power supplies using the various switches 160-173. In implementations. CTB 103 may receive reference current (Iref) or multiple reference voltages. In implementations, CTB 103 may include amplifier 130 or 131 that are reconfigurable into various "front-end" functions of an analog system. For example, amplifier 130 or 131 may be configured into a class-A mode to amplify analog input signals or can be configured into a class-AB mode to drive output analog signals.

Figure 7:
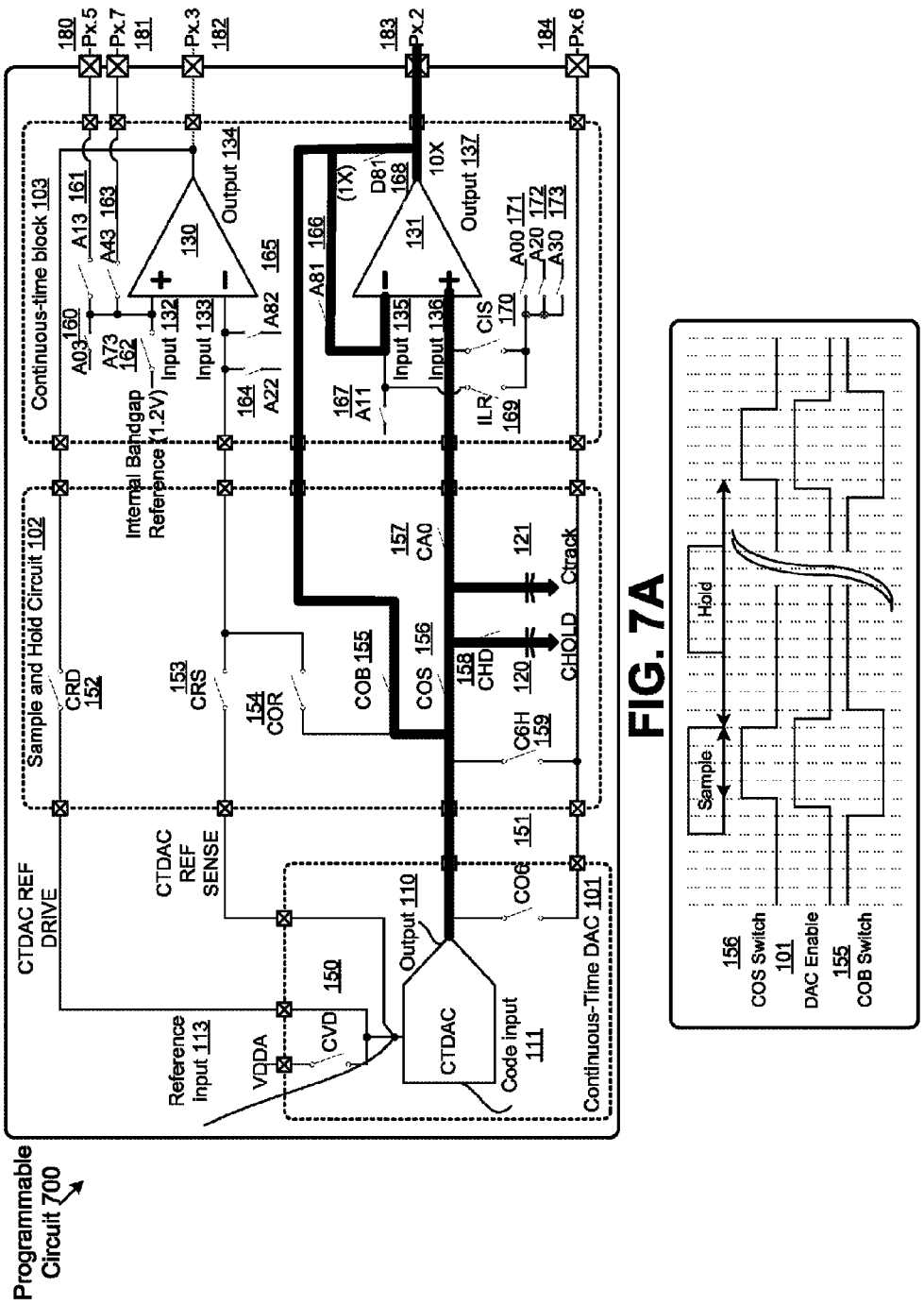
FIG. 7A is a circuit diagram illustrating a programmable circuit configured in a sample and hold mode, according to other implementations.
FIG. 7B illustrates a timing diagram for a programmable circuit operating in a sample and hold mode, according to implementations.

In implementations. CTB 103 may be configured and operate in various configurations (also referred to as "CTB configurations" herein). Some CTB configurations may be associated with the various programmable circuit modes, described herein. For example, in FIG. 2A programmable circuit 200 is configured in the blanking mode where CTB 103 is configured in a buffer configuration. In the buffer configuration, the CTB 103 is configured as a unity gain buffer (also referred to as a "unity gain amplifier" herein). In FIG. 3A, programmable circuit 300 is configured in PGA mode where CTB 103 is configured in an amplifier configuration. In an amplifier configuration, CTB 103 may amplify a signal (e.g. produce gain) and be configured with negative feedback, for example. In FIG. 3B, programmable circuit 350 is configured in PGA mode with auto gain control where CTB 103 is configured in an amplifier configuration with gain adjustment using control logic (e.g., AGC logic 363). In FIG. 4, programmable circuit 400 is configured for different reference signal modes where CTB 103 may be configured in a buffer configuration with a kelvin connection. In the buffer configuration with a kelvin connection, the negative input an amplifier 130 of CTB 103 is not shorted locally, but connects to the reference input 113 of CTDAC 101. In FIG. 5, programmable circuit 500 is configured in direct drive mode where CTB 103 is configured in a disconnected configuration. In the disconnected configuration, one or more amplifiers of CTB 103 may be disconnected from the sample and hold circuit and CTDAC 101, or be disconnected from a supply voltage to reduce power consumption. In FIG. 6, programmable circuit 600 is configured in direct drive mode where CTB 103 is configured in a buffer configuration. In FIG. 7A, programmable circuit 700 is configured in sample and hold mode where CTB 103 is configured in the buffer configuration. In may be noted that additional CTB configurations may be available in addition to those described with respect to the various modes. For example, CTB 103 may be configured in an external configuration where the CTB 103 is connected to various external components (e.g., resistor, capacitor, etc.) using pins 180-183. In another example, CTB 103 may be configured in a filter configuration to function as a filter, such as an active low pass filter.

Figure 2A:
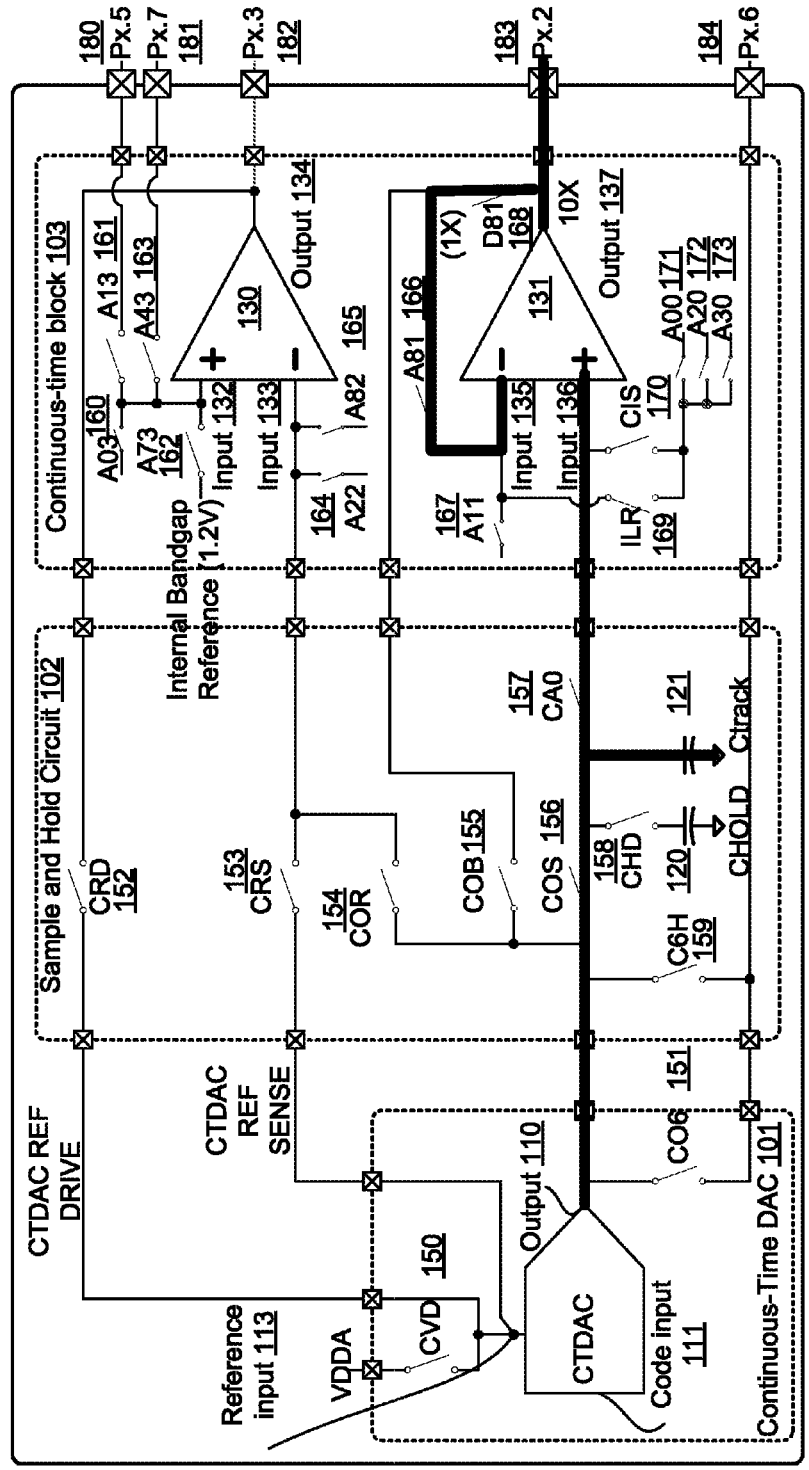
FIG. 2A is a circuit diagram illustrating a programmable circuit configured in a blanking mode, according to other implementations.
Figure 3A:
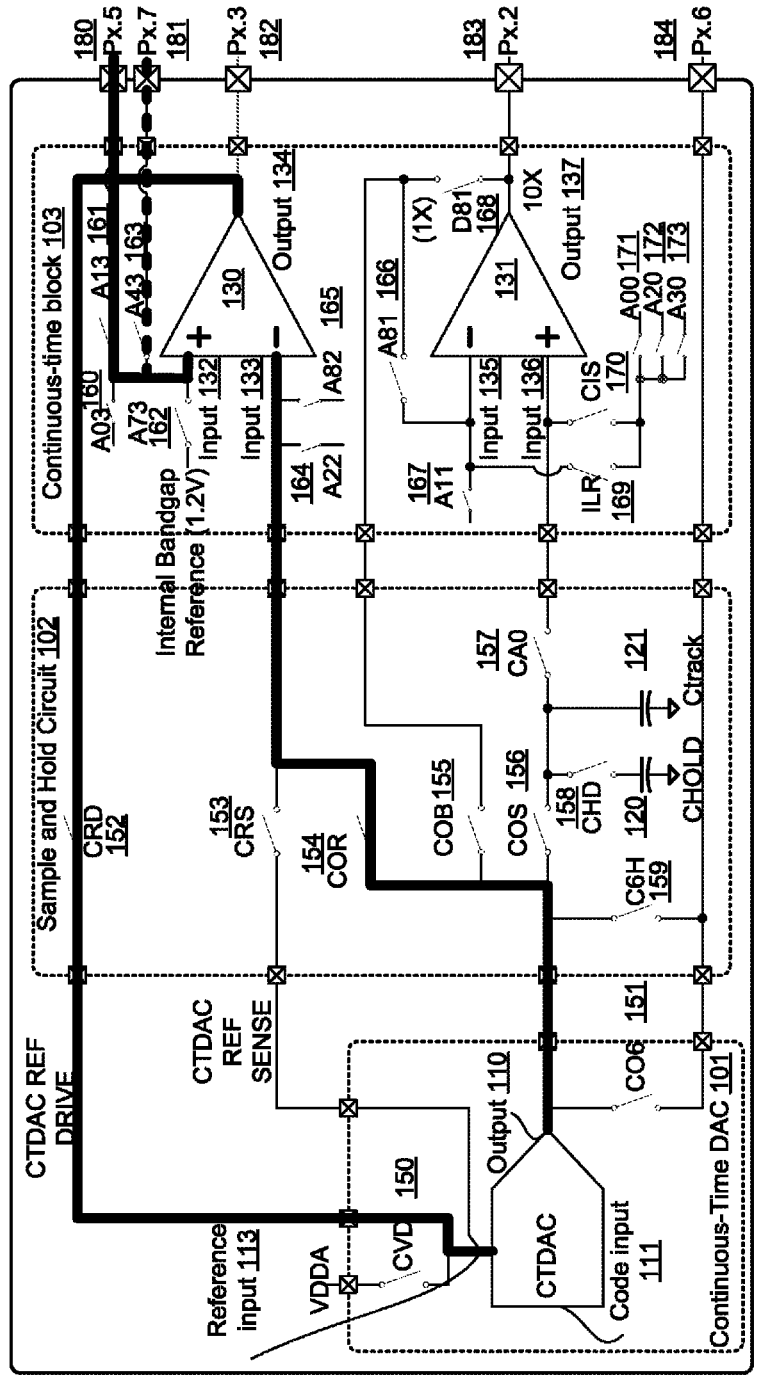
FIG. 3A is a circuit diagram illustrating a programmable circuit configured in a programmable gain amplifier mode, according to other implementations.
Figure 3B:
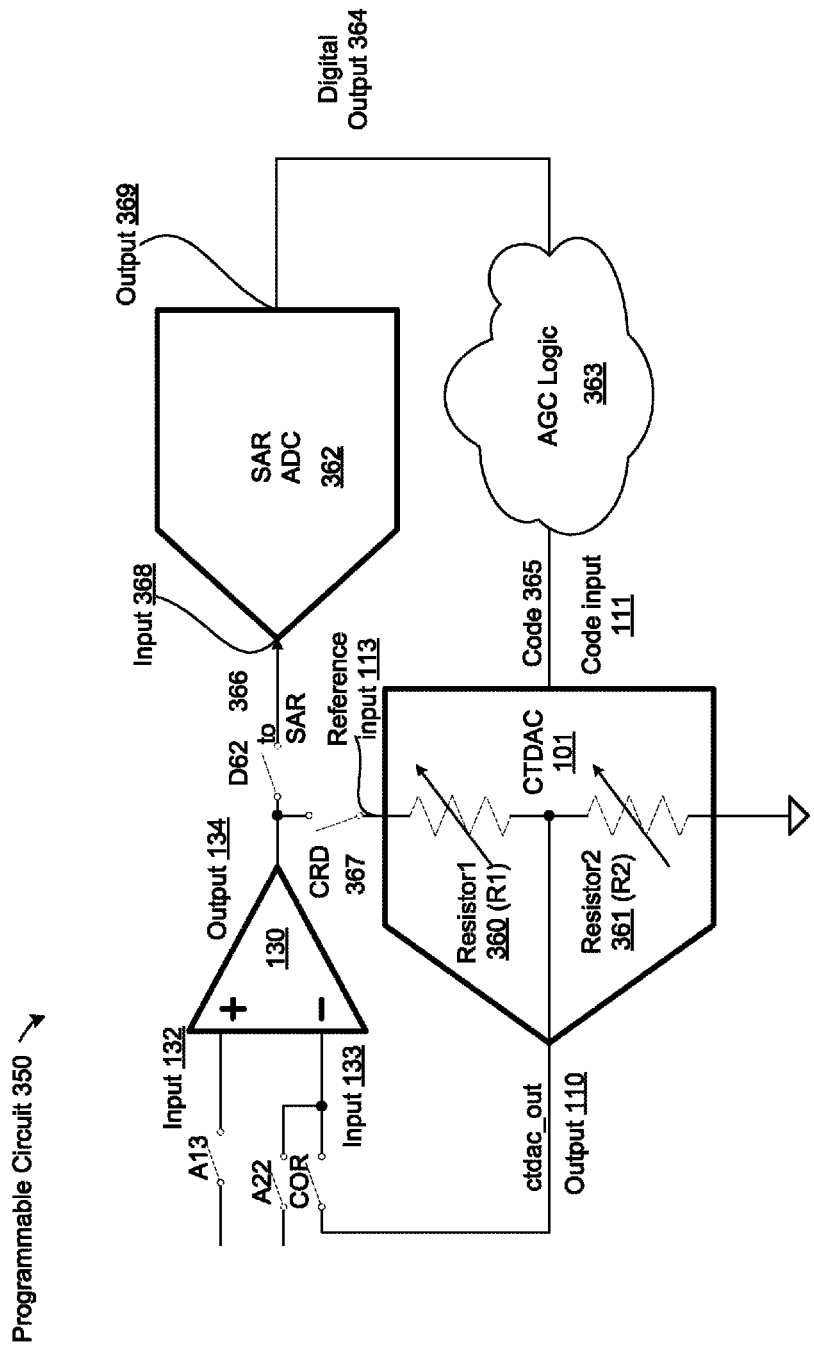
FIG. 3B is a circuit diagram illustrating a programmable circuit configured in a programmable gain amplifier mode performing auto gain control, according to other implementations.

FIG. 2A is a circuit diagram illustrating a programmable circuit configured in a blanking mode, according to other implementations. Programmable circuit 200 may be similar to programmable circuit 100 described with respect to FIG. 1. In blanking mode, SH circuit 102 may perform a blanking operation on the output signal of CTDAC 101. The programmable circuit 200 in blanking mode may perform the blanking operation to attenuate glitch on the CTDAC output signal. Glitch may be a result of code transitions at CTDAC 101. It may be noted that programmable circuit 200 may be concurrently operating in a blanking mode and a buffered drive mode. In buffered drive mode, programmable circuit 200 may buffer the output signal of CTDAC 101 with amplifier 131. Amplifier 131 may be configured as a unity gain amplifier. Buffered drive mode is further described with respect to FIG. 6.

In some implementations, capacitor 121 (Ctrack) may be used in the blanking operation. In other implementations, capacitor 120 (Chold) alone or capacitor 120 and capacitor 121 may be used in the blanking operation. As noted above, capacitor 120 may be significantly larger (e.g., 10× or greater) than capacitor 121. Using a smaller capacitor, such as capacitor 121, to perform a blanking operation may allow CTDAC 101 to operate faster than using capacitor 120. Using a larger capacitor, such as capacitor 120, to perform a blanking operation cause CTDAC 101 to operate slower than using capacitor 121, but may also increase attenuation of glitch produced by CTDAC 101. For purposes of illustration, rather than limitation, capacitor 121 (Ctrack) is described as being used for a blanking operation.

In implementations, programmable circuit 200 in blanking mode may perform a blanking operation by operating switch 156 (COS). Prior to a code transition at CTDAC 101, switch 156 of SH circuit 102 may be opened so the glitch on the CTDAC output signal is not propagated to amplifier 131. Switch 156 may be closed after the output signal of CTDAC 101 settles to roughly steady-state. Capacitor 121 may be used to store the previous value of the CTDAC output signal during the blanking operation (e.g., switch 156 is open), enabling amplifier 131 to buffer the previous value.

Figure 2B:
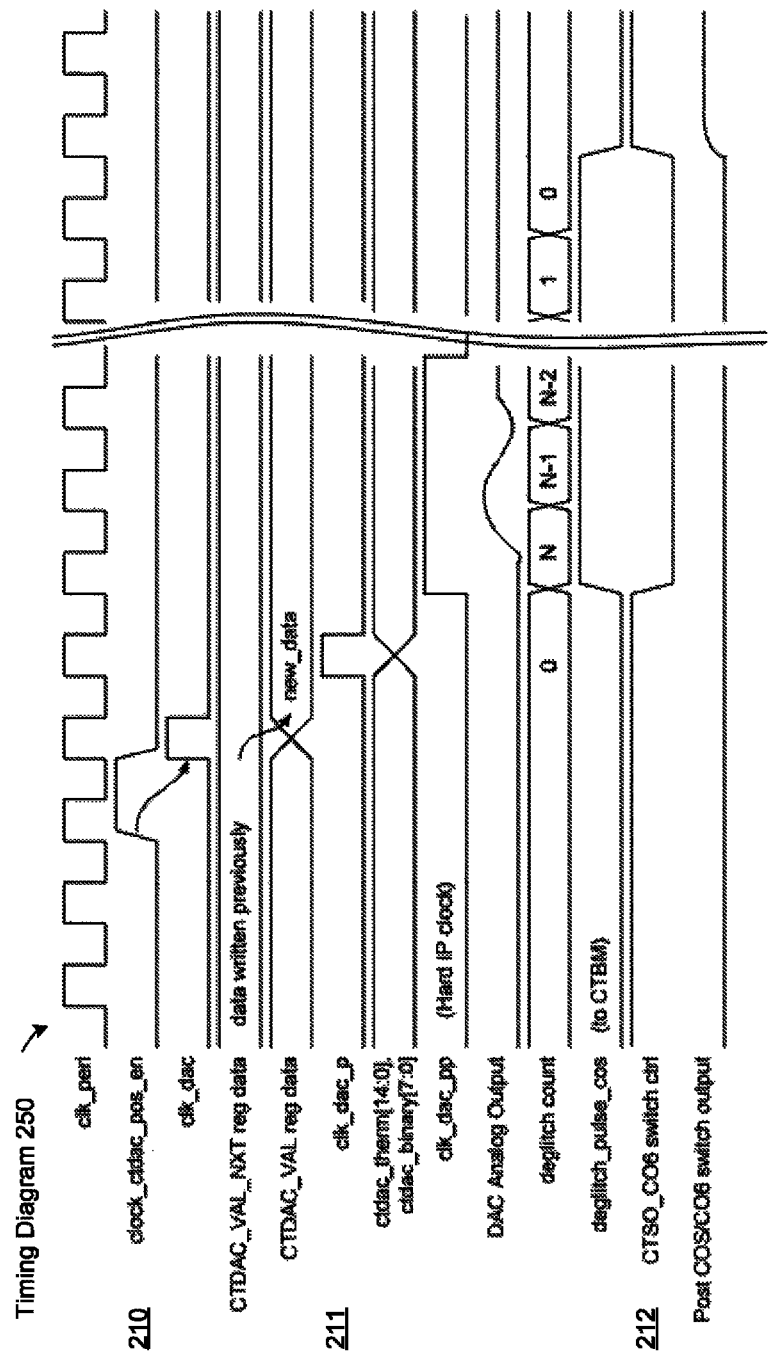
FIG. 2B illustrates a timing diagram for a programmable circuit configured in a blanking mode, according to other implementations.

FIG. 2B illustrates a timing diagram for a programmable circuit configured in a blanking mode, according to other implementations. The programmable circuit described with respect to FIG. 2B may be similar to programmable circuit 100 or 200 described with respect to FIG. 1 and FIG. 2A, respectively. As noted above, a blanking operation may be performed by opening switches (e.g., switch 156) when a code transition occurs at CTDAC 101. A code transition may be initiated when a new value or code is written to a CTDAC register (e.g., from CTDAC_VAL_NXT to reg data CTDAC_VAL reg data). Code may be written to the CTDAC register responsive to the signal 210 (e.g., clock_ctdac_pos_en or clk_dac). The value or code in the CTDAC register may be populated to CTDAC 101 using signal 211 (clk_dac_p). Switch 156 may be controlled by signal 212 (e.g., CTS0_C06 switch ctrl). With switch 156 open, the output signal of CTDAC 101 has time to settle before switch 156 is again closed and connected to a component, such as amplifier 131. In implementations, the length of time switch 156 is open is programmable and measured in the number of peri clock cycles (e.g., clk-peri).

FIG. 3A is a circuit diagram illustrating a programmable circuit configured in a PGA mode, according to other implementations. Programmable circuit 300 may be similar to programmable circuit 100 described with respect to FIG. 1. In PGA mode, output 110 of CTDAC 101 is connected to input 133 of amplifier 130 by closing switch 154. The output 134 of amplifier 130 is connected to the reference input 113 of CTDAC 101. An external signal that is to be amplified is supplied to input 132 of amplifier 130 through pin 180. In other implementations, a different external signal (that is to be amplified) is supplied to input 132 of amplifier 130 through pin 181. In still other implementations, an internal signal (that is to be amplified) may be supplied to input 132 of amplifier 130 using switches 160 or 162, rather than supplied through pin 180 or 181.

In PGA mode, the signal supplied to input 132 of amplifier 130 may be amplified by a gain factor controlled CTDAC 101. The gain of programmable circuit 300 may be controlled by the digital code supplied to code input 111 of CTDAC 101. In examples, the gain of programmable circuit 300 in PGA mode may be estimated by the resolution of CTDAC 101 divided by digital code input into CTDAC 101. For example, a 12-bit DAC is equivalent to 4096 levels (or 4095 steps). If the digital code chosen for CTDAC 101 is 2048 levels, the gain of programmable circuit 300 is 2 (4096/2048). The gain may range from 1 to 4096 using a CTDAC 101 with 12-bit resolution. In other implementations, programmable circuit 300 may be implemented with a CTDAC 101 with different resolution. In implementations, the output signal of amplifier 130 may be estimated as Vpos*GAIN=Vout (Vpos is the input signal at input 132 of amplifier 130, gain is described above, and Vout is the output signal of amplifier 130 at output 134).

In implementations where CTDAC 101 is implemented as a resistor-based DAC, CTDAC 101 may be estimated as a resistor voltage divider (Resistor 1 (R1) in series with Resistor 2 (R2)) equivalent circuit as illustrated in FIG. 3B. The output signal of CTDAC may be estimated as Vref*(R2/(R1+R2) (Vref is the reference signal supplied to reference input 113). R1 and R2 may be variable resistors that change resistance responsive to the digital code supplied to CTDAC 101. Applying the resistor voltage divider of the CTDAC 101 in the feedback loop with amplifier 130 may be similar as having adjustable resistors in the feedback of the amplifier 130. Amplifier 130 with a resistor voltage divider in feedback may be equivalent to an amplifier with divided negative feedback.

In implementations, programmable circuit 300 may be configured in a programmable attenuator mode to perform a programmable attenuator operation. As noted above, the output signal of CTDAC 101 is a ratio of the reference signal (e.g., Vref*(R2/(R1+R2))). The output signal of CTDAC 101 may be an attenuated version of Vref. The attenuation may be controlled by the code received by code input 111 (e.g., the code controls the resistor values of R1 and R2). The other circuit connections may be similar to those described with respect to programmable circuit 300 in PGA mode. An input signal received from pin 180, pin 181, or an internal signal may be attenuated. The attenuated signal from output 110 may be directly driven to pin 184 or buffered using amplifier 131.

FIG. 3B is a circuit diagram illustrating a programmable circuit configured in a PGA mode performing automatic gain control, according to other implementations. Programmable circuit 350 may be similar to programmable circuit 100 or 300 described with respect to FIG. 1 and FIG. 3A, respectively. For purposes of illustration, rather than limitation, programmable circuit 350 has been shown in a simplified form so as to aid in understanding. AGC may be an operation to control an output signal (e.g., output signal of amplifier 130) within a given output range despite a varying input signal. In some implementations, programmable circuit 350 may control the output signal of amplifier 130 within a given range using the AGC operation.

In implementations, in performing an automatic gain operation, programmable circuit 350 may be used as a PGA to drive an analog-to-digital converter (ADC), such as successive-approximation-register (SAR) ADC 362. Switch 366 may be controlled to connect the output 134 of amplifier 130 to the input 368 of SAR ADC 362. In other implementations, a different ADC or different components may be configured to perform AGC. SAR ADC 362, responsive to receiving an output signal from amplifier 130, may output a digital output signal 364 from output 369 of SAR ADC 362. Based on the digital output signal 364, AGC logic 363 may control the code 365 sent to code input 111 of CTDAC 101 to adjust the gain of CTDAC 101, and keep the output signal of amplifier 130 within a given range. For example, the gain of the PGA maybe adjusted so the SAR ADC 362 consistently receives a large output signal (e.g., 4.5V-5V) from amplifier 130. Responsive to receiving a small output signal (e.g., out of the range of 4.5V-5V) from amplifier 130. AGC logic 363, responsive to the digital output signal 364, may adjust the code 365. Code 365 may be used to adjust the gain of the PGA. Responsive to adjusting the gain of the PGA the output signal of amplifier 130 is controlled to return to a large output signal.

It may be noted that CTDAC 101 shows a simplified resistor network using resistor1 360 and resistor2 361. It may be noted that resistor1 360 and resistor2 361 may illustrate the equivalent resistance of CTDAC 101. In may also be noted that the reference signal to reference input 113 of CTDAC 101 may be controlled using switch 367.

FIG. 4 is a circuit diagram illustrating a programmable circuit configurable with different reference signal modes, according to other implementations. Programmable circuit 400 may be similar to programmable circuit 100 described with respect to FIG. 1. In some implementations, programmable circuit 400 may be configured with different reference signal modes so that CTDAC 101 receives different reference signals. The reference signal (e.g., reference voltage or Vref) is supplied to reference input 113. The reference signal may be VDDA (e.g., external supply voltage), or an internal or external reference signal buffered with CTB 103. For example, to connect reference input 113 to an external supply, switch 150 may be closed (and other switches connected to reference input 113 are open) so that CTDAC 101 may receive a reference signal (e.g., VDDA) from an off-chip supply external to programmable circuit 400. Using an external supply voltage as the reference signal may enable CTDAC 101 to be ratio-metric (e.g., the output of CTDAC 101 may be a ratio of the supply voltage). In another example as illustrated with the bold solid line, to connect reference input 113 to an internal reference signal, an internal voltage signal (e.g., internal bandgap reference) may be supplied to input 132 of amplifier 130. The output of amplifier 130 may be connected to reference input 113 by closing switch 152. The reference signal may be further connected to input 133 of amplifier 130 by closing switch 153. In another example, to connect reference input 113 to an external reference signal, the external reference signal may be supplied through pin 180 or pin 181. It may be noted that a kelvin connection may be provided using switch 153

(CRS) so the dynamic voltage drop (IR drop) through switch 152 (CRD) is suppressed by the loop gain of amplifier 130.

FIG. 5 is a circuit diagram illustrating a programmable circuit configured in a direct drive mode, according to other implementations. Programmable circuit 500 may be similar to programmable circuit 100 described with respect to FIG. 1. In direct drive mode (also referred to as un-buffered mode), the output signal of CTDAC 101 (via output 110) is routed directly to an external pin, such as pin 184. In direct drive mode, switch 151 is closed. In an alternative implementation, two switches, switch 151 (CO6) or switch 159 (C6H), are available to perform direct drive mode. Either switch 151 or 159 may be closed, while the other is open, to operated programmable circuit 500 in direct drive mode. The signal path for direct drive is illustrated with a bold solid line. An alternative direct drive mode signal path through switch 159 is illustrated with bold dashed line connected the bold solid line.

FIG. 6 is a circuit diagram illustrating a programmable circuit configured in a buffered drive mode, according to other implementations. Programmable circuit 600 may be similar to programmable circuit 100 described with respect to FIG. 1. In buffered drive mode (also referred to as buffered mode), the output signal of CTDAC 101 (via output 110) is routed through amplifier 131. The output 110 of CTDAC 101 is connected in input 136 of amplifier 131. The output 137 of amplifier 131 in connected to pin 183 and connected in feedback with input 135 of amplifier 131. Switch 156, switch 157, switch 168, and switch 166 may be closed in buffered drive mode. As illustrated, the output signal of CTDAC 101 is buffered using amplifier 131. Amplifier 131 may be implemented as a unity gain amplifier. In some implementations, programmable circuit 600 may implement different drive modes depending on the off-chip load. In implementations, programmable circuit 600 may drive 10× the current in buffered drive mode compared to direct drive mode. In implementations, programmable circuit 600 may be configured to operate in buffered drive mode alone or operate in buffered drive mode concurrently with other modes described herein. For example, programmable circuit 600 may be configured to operate in buffered drive mode alone, and not configured to operate in blanking mode or SH mode. In another example, programmable circuit 600 may be configured to operate in buffered drive mode and blanking mode, so glitch is attenuated from the output signal of CTDAC 101, for example. In still another example, programmable circuit 600 may be configured to operate in buffered drive mode and SH mode (e.g., in a low power operation where CTDAC 101 may be disabled during the hold portion of the sample and hold operation, and a larger capacitor 120 (Chold) may be implemented).

FIG. 7A is a circuit diagram illustrating a programmable circuit 700 configured in a SH mode, according to other implementations. FIG. 7B illustrates a timing diagram for a programmable circuit 700 operating in a SH mode, according to implementations. Programmable circuit 700 may be similar to programmable circuit 100 described with respect to FIG. 1. In some implementations, programmable circuit 700 may be configured in a sample and hold mode to perform a SH operation. In implementations, both capacitors 120 and 120 may be used in SH mode. In the sample portion of the SH operation, switch 156 is closed, switch 155 is open, and CTDAC 101 is on, and the output signal of CTDAC 101 is sampled on capacitor 120 and capacitor 121. In the hold portion of the sample and hold operation, switch 156 is open, switch 155 is closed, and CTDAC 101 is disabled and amplifier 131 may buffer the value on capacitor 120 and capacitor 121. It may be noted that in implementations, in the hold operation, switch 155 may be closed to help handle leakage. In other implementations, switch 155 may be open during the hold operation.

In other implementations, SH operations may be performed on signals other than the CTDAC output signal. For example, in implementations, an external signal may be routed through pin 184 to capacitor 120 using switch 159. Switch 158 may be closed and switch 156 may be controlled, similarly as described above, to perform the sample portion and hold portion of the SH operation on an external signal. In another example, an internal signal may be routed through switch 170 and through switch 171, 172, or 173. Switch 158 and 157 may be closed, and switch 170 may be controlled to perform the sample portion and hold portion of a SH operation on the internal signal.

Figure 8:
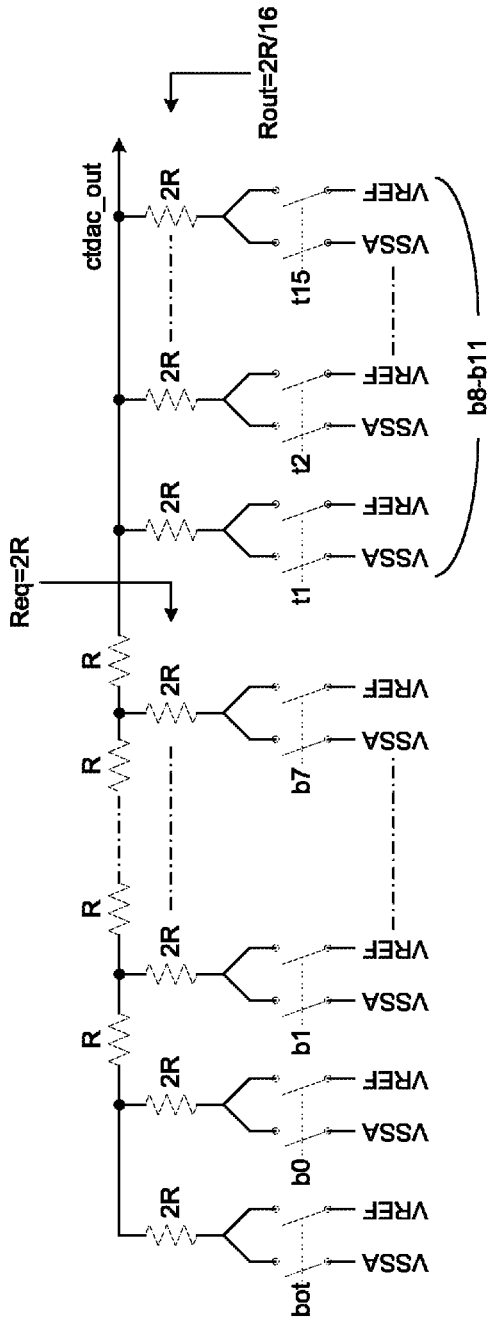
FIG. 8 is a circuit diagram illustrating a continuous-time digital-to-analog converter, according to some implementations.

FIG. 8 is a circuit diagram illustrating a continuous-time digital-to-analog converter, according to some implementations. CTDAC 800 may be similar to CTDAC 101 described with respect to FIG. 1. CTDAC 800 shows a 12-bit segmented DAC. It may be noted CTDAC 800 is provided for purposes of illustration, rather than limitation. CTDAC 800 may have a different architecture and be any resolution.

CTDAC 800 illustrates 4-bits of most significant bits (MSB) implemented as a 15 level (t1-t15) thermometer array. 8-bits of LSB are implemented as an R2R array. The equivalent resistance of the R-2R array is 2R, which is parallel to the 15 thermometer resistors. The equivalent output resistance is 2R/16. As a code is received by CTDAC 800, the switches (bot-b7, and t1-t15) may be controlled to accordingly so the output signal of CTDAC 800 reflects the received code.

Figure 9:
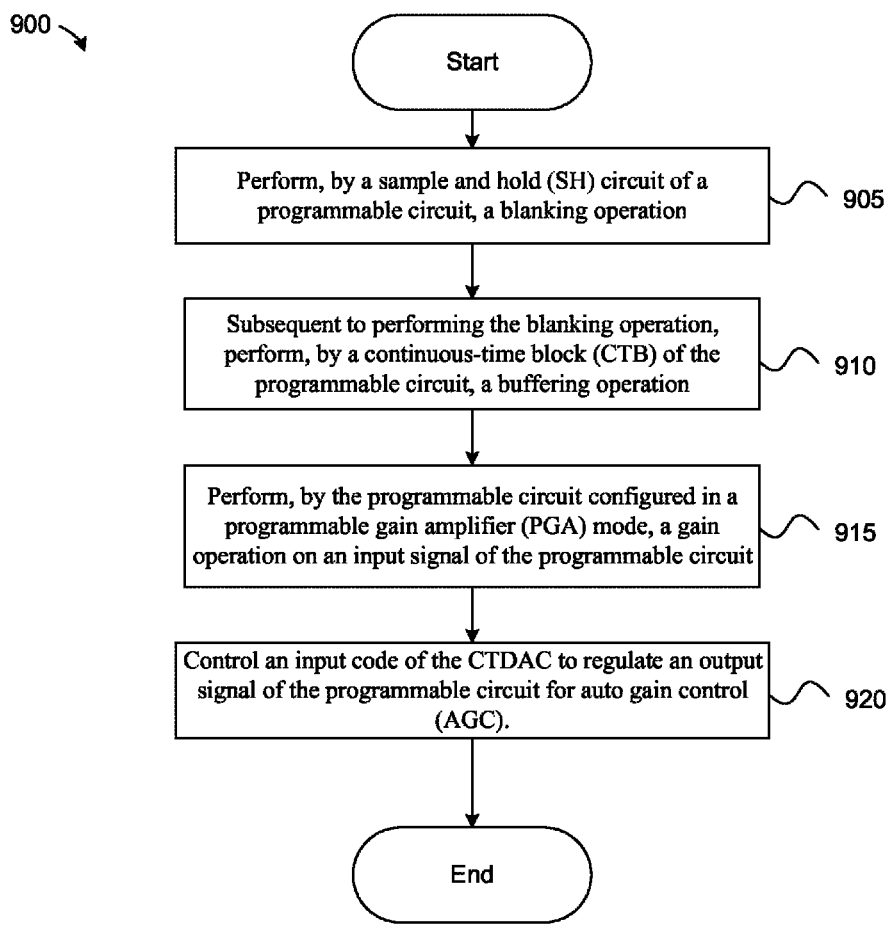
FIG. 9 illustrates a flow diagram of a method of a programmable circuit performing one or more modes, according to another implementation.

FIG. 9 illustrates a flow diagram of a method of a programmable circuit performing one or more modes, according to another implementation. The method 900 may be performed by processing logic that comprises hardware (e.g., circuitry, dedicated logic, programmable logic, microcode, etc.), software (such as instructions run on a processing device), or a combination thereof. The method 900 may be performed wholly or in part by programmable circuit 100.

Method 900 begins at block 905 where processing logic performing the method performs a blanking operation on an output signal of a continuous-time digital-to-analog converter (CTDAC) of the programmable circuit. Method 900 continues at block 910 where processing logic subsequent to performing the blanking operation, performs a buffering operation to buffer the CTDAC output signal. The programmable circuit is configured to operate in a buffered drive mode and in a blanking mode. Preforming the blanking operation in the blanking mode includes attenuating glitch on the CTDAC output signal by closing a switch of the SH circuit.

Method 900 continues in block 915 where processing logic performs a gain operation on an input signal of the programmable circuit. The programmable circuit is configured to operate in PGA mode. Performing the gain operation includes coupling a negative input of a first amplifier of the CTB to a first output of the CTDAC, coupling the input signal to the positive input of the first amplifier; and coupling a second output of the first amplifier to a reference input of the CTDAC. Method 900 continues at block 920 where processing logic controls an input code of the CTDAC to regulate an output signal of the programmable circuit for auto gain control (AGC).

Figure 10:
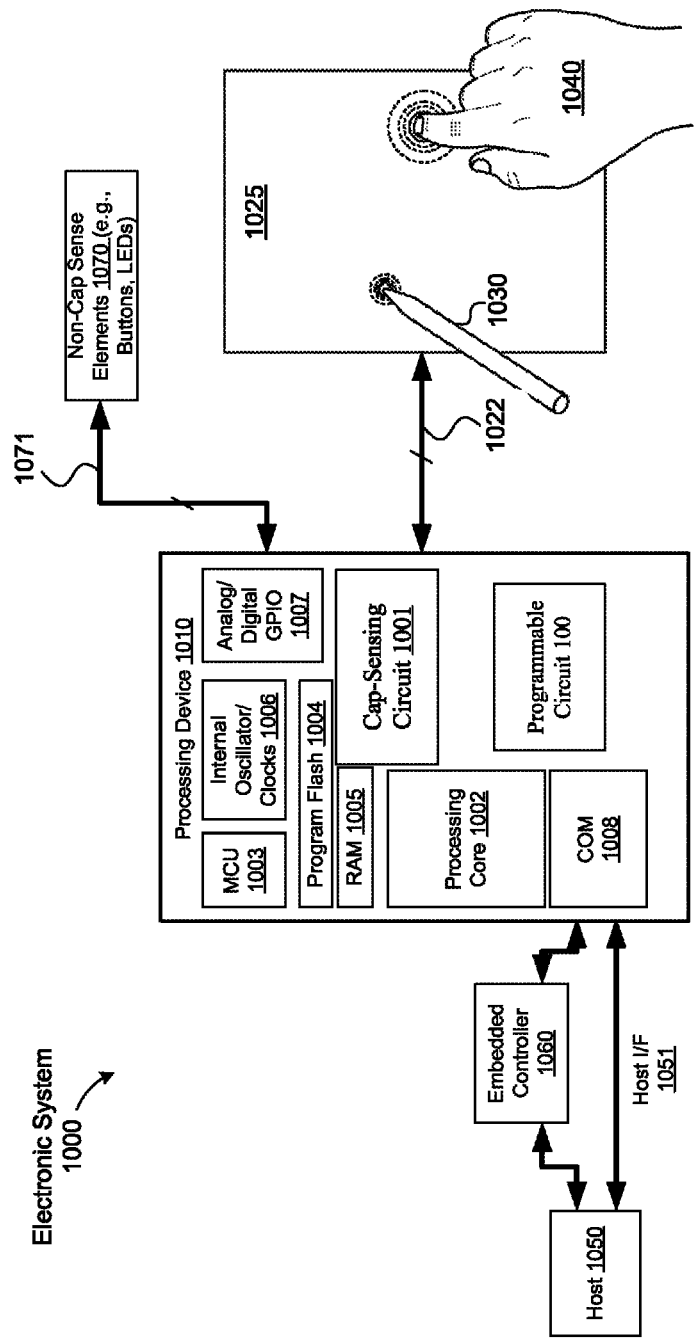
FIG. 10 is a block diagram illustrating one implementation of an electronic system having a processing device including a programmable circuit.

FIG. 10 is a block diagram illustrating one implementation of an electronic system 1000 having a processing device 1010 including a programmable circuit. Programmable circuit 100 may include features described with respect to programmable circuit 100, 200, 300, 350, 400, 500, 600, or 700, described herein. In implementations, the processing device 1010 is configured to detect one or more touches proximate a touch-sensing device, such as the capacitive-sense array 1025. The processing device can detect conductive objects, such as touch objects 1040 (fingers or passive styluses, an active stylus 1030, or any combination thereof. The capacitance-sensing circuit 1001 can measure touch data on the capacitive-sense array 1025. The touch data may be represented as multiple cells, each cell representing an intersection of sense elements (e.g., electrodes) of the capacitive-sense array 1025. In another implementation, the touch data is a 2D capacitive image of the capacitive-sense array 1025. In one implementation, when the capacitance-sensing circuit 1001 measures mutual capacitance of the touch-sensing device (e.g., capacitive-sense array 1025), the capacitance-sensing circuit 1001 obtains a 2D capacitive image of the touch-sensing device and processes the data for peaks and positional information. In another implementation, the processing device 1010 is a microcontroller that obtains a capacitance touch signal data set, such as from a sense array, and finger detection firmware executing on the microcontroller identifies data set areas that indicate touches, detects and processes peaks, calculates the coordinates, or any combination therefore. The firmware identifies the peaks using the implementations described herein. The firmware can calculate a precise coordinate for the resulting peaks. In one implementation, the firmware can calculate the precise coordinates for the resulting peaks using a centroid algorithm, which calculates a centroid of the touch, the centroid being a center of mass of the touch. The centroid may be an X/Y coordinate of the touch. Alternatively, other coordinate interpolation algorithms may be used to determine the coordinates of the resulting peaks. The microcontroller can report the precise coordinates to a host processor, as well as other information. It may be appreciated that processing device 1010 may be used in applications other to, or in addition to, touch sensing.

Electronic system 1000 includes processing device 1010, capacitive-sense array 1025, stylus 1030, host processor 1050, embedded controller 1060, and non-capacitive sense elements 1070. The capacitive sense elements are electrodes of conductive material, such as copper. The sense elements may also be part of an ITO panel. The capacitive sense elements can be configurable to allow the capacitive-sensing circuit 1001 to measure self-capacitance, mutual capacitance, or any combination thereof. In the depicted implementation, the electronic system 1000 includes the capacitive-sense array 1025 coupled to the processing device 1010 via bus 1022. The capacitive-sense array 1025 may include a multi-dimension capacitive-sense array. The multi-dimension sense array includes multiple sense elements, organized as rows and columns. In another implementation, the capacitive-sense array 1025 operates as an all-points-addressable ("APA") mutual capacitive-sense array. In another implementation, the capacitive-sense array 1025 operates as a coupled-charge receiver. In another implementation, the capacitive-sense array 1025 is non-transparent capacitive-sense array (e.g., PC touchpad). The capacitive-sense array 1025 may be disposed to have a flat surface profile. Alternatively, the capacitive-sense array 1025 may have non-flat surface profiles. Alternatively, other configurations of capacitive-sense arrays may be used. For example, instead of vertical columns and horizontal rows, the capacitive-sense array 1025 may have a hexagon arrangement, or the like, as would be appreciated by one of ordinary skill in the art having the benefit of this disclosure. In one implementation, the capacitive-sense array 1025 may be included in an ITO panel or a touch screen panel.

The operations and configurations of the processing device 1010 and the capacitive-sense array 1025 for detecting and tracking the touch object 1040 and stylus 1030 are described herein. In short, the processing device 1010 is configurable to detect a presence of the touch object 1040, a presence of a stylus 1030 on the capacitive-sense array 1025, or any combination thereof. The processing device 1010 may detect and track the stylus 1030 and the touch object 1040 individually on the capacitive-sense array 1025. In one implementation, the processing device 1010 can detect and track both the stylus 1030 and touch object 1040 concurrently on the capacitive-sense array 1025. If the touching object is an active stylus, in one implementation, the active stylus 1030 is configurable to operate as the timing "master," and the processing device 1010 adjusts the timing of the capacitive-sense array 1025 to match that of the active stylus 1030 when the active stylus 1030 is in use. In one implementation, the capacitive-sense array 1025 capacitively couples with the active stylus 1030, as opposed to conventional inductive stylus applications. It should also be noted that the same assembly used for the capacitive-sense array 1025, which is configurable to detect touch objects 1040, is also used to detect and track a stylus 1030 without an additional PCB layer for inductively tracking the active stylus 1030.

In the depicted implementation, the processing device 1010 includes analog and/or digital general purpose input/output ("GPIO") ports 1007. GPIO ports 1007 may be programmable. GPIO ports 1007 may be coupled to a Programmable Interconnect and Logic ("PIL"), which acts as an interconnect between GPIO ports 1007 and a digital block array of the processing device 1010 (not shown). The digital block array may be configurable to implement a variety of digital logic circuits (e.g., DACs, digital filters, or digital control systems) using, in one implementation, configurable user modules ("UMs"). The digital block array may be coupled to a system bus. Processing device 1010 may also include memory (e.g., memory device), such as random access memory ("RAM") 1005 and program flash 1004. RAM 1005 may be static RAM ("SRAM"), and program flash 1004 may be a non-volatile storage, which may be used to store firmware (e.g., control algorithms executable by processing core 1002 to implement operations described herein). Processing device 1010 may also include a memory controller unit ("MCU") 1003 coupled to memory and the processing core 1002. The processing core 1002 is a processing element configured to execute instructions or perform operations. The processing device 1010 may include other processing elements as would be appreciated by one of ordinary skill in the art having the benefit of this disclosure. It should also be noted that the memory may be internal to the processing device or external to it. In the case of the memory being internal, the memory may be coupled to a processing element, such as the processing core 1002. In the case of the memory being external to the processing device, the processing device is coupled to the other device in which the memory resides as would be appreciated by one of ordinary skill in the art having the benefit of this disclosure.

The processing device 1010 may also include an analog block array (not shown). The analog block array is also coupled to the system bus. Analog block array may also be configurable to implement a variety of analog circuits (e.g., ADCs or analog filters) using, in one implementation, configurable UMs. The analog block array may also be coupled to the GPIO 1007.

As illustrated, capacitance-sensing circuit 1001 may be integrated into processing device 1010. Capacitance-sensing circuit 1001 may include analog I/O for coupling to an external component, such as touch-sensor pad (not shown), capacitive-sense array 1025, touch-sensor slider (not shown), touch-sensor buttons (not shown), and/or other devices. The capacitance-sensing circuit 1001 may be configurable to measure capacitance using mutual-capacitance sensing techniques, self-capacitance sensing technique, charge coupling techniques, or the like. In one implementation, capacitance-sensing circuit 1001 operates using a charge accumulation circuit, a capacitance modulation circuit, or other capacitance sensing methods known by those skilled in the art. In an implementation, the capacitance-sensing circuit 1001 is of the Cypress TMA-3xx, TMA-4xx, or TMA-xx families of touch screen controllers. Alternatively, other capacitance-sensing circuits may be used. The mutual capacitive-sense arrays, or touch screens, as described herein, may include a transparent, conductive sense array disposed on, in, or under either a visual display itself (e.g. LCD monitor), or a transparent substrate in front of the display. In an implementation, the TX and RX electrodes are configured in rows and columns, respectively. It should be noted that the rows and columns of electrodes can be configured as TX or RX electrodes by the capacitance-sensing circuit 1001 in any chosen combination. In one implementation, the TX and RX electrodes of the sense array 1025 are configurable to operate as a TX and RX electrodes of a mutual capacitive-sense array in a first mode to detect touch objects, and to operate as electrodes of a coupled-charge receiver in a second mode to detect a stylus on the same electrodes of the sense array. The stylus, which generates a stylus TX signal when activated, is used to couple charge to the capacitive-sense array, instead of measuring a mutual capacitance at an intersection of a RX electrode and a TX electrode (a sense element) as done during mutual-capacitance sensing. An intersection between two sense elements may be understood as a location at which one sense electrode crosses over or overlaps another, while maintaining galvanic isolation from each other. The capacitance-sensing circuit 1001 does not use mutual-capacitance or self-capacitance sensing to measure capacitances of the sense elements when performing a stylus sensing. Rather, the capacitance-sensing circuit 1001 measures a charge that is capacitively coupled between the sense array 1025 and the stylus as described herein. The capacitance associated with the intersection between a TX electrode and an RX electrode can be sensed by selecting every available combination of TX electrode and RX electrode. When a touch object, such as a finger or stylus, approaches the capacitive-sense array 1025, the object causes a decrease in mutual capacitance between some of the TX/RX electrodes. In another implementation, the presence of a finger increases the coupling capacitance of the electrodes. Thus, the location of the finger on the capacitive-sense array 1025 can be determined by identifying the RX electrode having a decreased coupling capacitance between the RX electrode and the TX electrode to which the TX signal was applied at the time the decreased capacitance was measured on the RX electrode. Therefore, by sequentially determining the capacitances associated with the intersection of electrodes, the locations of one or more inputs can be determined. It should be noted that the process can calibrate the sense elements (intersections of RX and TX electrodes) by determining baselines for the sense elements. It should also be noted that interpolation may be used to detect finger position at better resolutions than the row/column pitch as would be appreciated by one of ordinary skill in the art having the benefit of this disclosure. In addition, various types of coordinate interpolation algorithms may be used to detect the center of the touch as would be appreciated by one of ordinary skill in the art having the benefit of this disclosure.

In an implementation, the electronic system 1000 may also include non-capacitive sense elements 1070 coupled to the processing device 1010 via bus 1071 and GPIO port 1007. The non-capacitive sense elements 1070 may include buttons, light emitting diodes ("LEDs"), and other user interface devices, such as a mouse, a keyboard, or other functional keys that do not use capacitance sensing. In one implementation, buses 1022, and 1071 are embodied in a single bus. Alternatively, these buses may be configured into any combination of one or more separate buses.

Processing device 1010 may include internal oscillator/clocks 1006 and communication block ("COM") 1008. In another implementation, the processing device 1010 includes a spread spectrum clock (not shown). The oscillator/clocks block 1006 provides clock signals to one or more of the components of processing device 1010. Communication block 1008 may be used to communicate with an external component, such as a host processor 1050, via host interface ("I/F") line 1051. Alternatively, processing device 1010 may also be coupled to embedded controller 1060 to communicate with the external components, such as host processor 1050. In one implementation, the processing device 1010 is configurable to communicate with the embedded controller 1060 or the host processor 1050 to send and/or receive data.

Processing device 1010 may reside on a common carrier substrate such as, for example, an IC die substrate, a multi-chip module substrate, or the like. Alternatively, the components of processing device 1010 may be one or more separate integrated circuits and/or discrete components. In one exemplary implementation, processing device 1010 is the Programmable System on a Chip (PSoC®) processing device, developed by Cypress Semiconductor Corporation, San Jose, Calif. Alternatively, processing device 1010 may be one or more other processing devices known by those of ordinary skill in the art, such as a microprocessor or central processing unit, a controller, special-purpose processor, digital signal processor ("DSP"), an application specific integrated circuit ("ASIC"), a field programmable gate array ("FPGA"), or the like.

It should also be noted that the implementations described herein are not limited to having a configuration of a processing device coupled to a host, but may include a system that measures the capacitance on the sensing device and sends the raw data to a host computer where it is analyzed by an application. In effect, the processing that is done by processing device 1010 may be done in the host.

Capacitance-sensing circuit 1001 may be integrated into the IC of the processing device 1010, or alternatively, in a separate IC. Alternatively, descriptions of capacitance-sensing circuit 1001 may be generated and compiled for incorporation into other integrated circuits. For example, behavioral level code describing the capacitance-sensing circuit 1001, or portions thereof, may be generated using a hardware descriptive language, such as VHDL or Verilog, and stored to a machine-accessible medium (e.g., CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout may represent various levels of abstraction to describe capacitance-sensing circuit 1001.

It should be noted that the components of electronic system 1000 may include all the components described above. Alternatively, electronic system 1000 may include some of the components described above.

In one implementation, the electronic system 1000 is used in a tablet computer. Alternatively, the electronic device may be used in other applications, such as a notebook computer, a mobile handset, a personal data assistant ("PDA"), a keyboard, a television, a remote control, a monitor, a handheld multi-media device, a handheld media (audio and/or video) player, a handheld gaming device, a signature input device for point of sale transactions, an eBook reader, global position system ("GPS") or a control panel. The implementations described herein are not limited to touch screens or touch-sensor pads for notebook implementations, but can be used in other capacitive sensing implementations, for example, the sensing device may be a touch-sensor slider (not shown) or touch-sensor buttons (e.g., capacitance sensing buttons). In one implementation, these sensing devices include one or more capacitive sensors or other types of capacitance-sensing circuitry. The operations described herein are not limited to notebook pointer operations, but can include other operations, such as lighting control (dimmer), volume control, graphic equalizer control, speed control, or other control operations requiring gradual or discrete adjustments. It should also be noted that these implementations of capacitive sensing implementations may be used in conjunction with non-capacitive sensing elements, including but not limited to pick buttons, sliders (ex. display brightness and contrast), scroll-wheels, multi-media control (ex. volume, track advance, etc.) handwriting recognition, and numeric keypad operation.

The implementations described herein may be used in various designs of mutual-capacitance sensing arrays of the capacitance sensing system, or in self-capacitance sensing arrays. In one implementation, the capacitance sensing system detects multiple sense elements that are activated in the array, and can analyze a signal pattern on the neighboring sense elements to separate noise from actual signal. The implementations described herein are not tied to a particular capacitive sensing solution and can be used as well with other sensing solutions, including optical sensing solutions, as would be appreciated by one of ordinary skill in the art having the benefit of this disclosure.

In the above description, numerous details are set forth. It will be apparent, however, to one of ordinary skill in the art having the benefit of this disclosure, that implementations of the present invention may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "measuring." "generating," "sampling." "converting." or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" or "an implementation" or "one implementation" throughout is not intended to mean the same implementation or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding or carrying a set of instructions for execution by the machine and that causes the machine to perform any one or more of the methodologies of the present implementations. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present implementations.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present implementations are not described with reference to any particular programming language. It will be appreciated that a variety of programming languages may be used to implement the teachings of the implementations as described herein.

The above description sets forth numerous specific details such as examples of specific systems, components, methods and so forth, in order to provide a good understanding of several implementations of the present invention. It will be apparent to one skilled in the art, however, that at least some implementations of the present invention may be practiced without these specific details. In other instances, well-known components or methods are not described in detail or are presented in simple block diagram format in order to avoid unnecessarily obscuring the present invention. Thus, the specific details set forth above are merely exemplary. Particular implementations may vary from these exemplary details and still be contemplated to be within the scope of the present invention.

It is to be understood that the above description is intended to be illustrative and not restrictive. Many other implementations will be apparent to those of skill in the art upon reading and understanding the above description. The scope of the invention should, therefore, be determined with reference to the appended claims, along with the full scope of equivalents to which such claims are entitled.

In the above description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail, but rather in a block diagram in order to avoid unnecessarily obscuring an understanding of this description.

Reference in the description to "one implementation" or "an implementation" means that a particular feature, structure, or characteristic described in connection with the implementation is included in at least one implementation of the invention. The phrase "in one implementation" located in various places in this description does not necessarily refer to the same implementation. It should be noted that the term capacitor, as used herein, may refer to any combination of conductors and dielectrics that produce a capacitance between the conductors, as well as discrete components. For example, as described herein, a capacitance can created as an intersection between two electrodes. An intersection between the first electrode and second electrode is also called a sensor. An intersection between two sense elements (electrodes) may be understood as a location at which one sense electrode crosses over or overlaps another, while maintaining galvanic isolation from each other. In other cases, a discrete capacitor may be used to produce a capacitance.

What is claimed is:

1. A programmable circuit comprising:
   a continuous-time digital-to-analog converter (CTDAC);
   a continuous-time block (CTB), coupled to the CTDAC; and
   a sample and hold (SH) circuit coupled to the CTDAC and the CTB, wherein the programmable circuit is configurable to operate in a plurality modes, wherein the programmable circuit is configured to operate in a buffered drive mode of the plurality of modes to buffer an output signal from the CTDAC, wherein, in the buffered drive mode, the programmable circuit is further configured to operate in a blanking mode of the plurality of modes to cause the SH circuit to perform a blanking operation on the CTDAC output signal.

2. The programmable circuit of claim 1, wherein the CTB is configurable to operate in a plurality of configurations comprising a buffer configuration, an amplifier configuration, and a buffer configuration with a kelvin connection.

3. The programmable circuit of claim 1, wherein, to perform the blanking operation in the blanking mode, the programmable circuit is to attenuate a glitch on the CTDAC output signal, wherein the glitch results from a code transition of the CTDAC.

4. The programmable circuit of claim 1, where the programmable circuit is configured to operate in a programmable gain amplifier (PGA) mode to perform a gain operation on an input signal of the programmable circuit.

5. The programmable circuit of claim 4, wherein the input signal of the programmable circuit in the PGA mode is an external signal that is supplied by a source external to the programmable circuit.

6. The programmable circuit of claim 4, wherein the CTB comprises
   a first amplifier comprising a positive input, a negative input, and a second output, wherein, in the PGA mode, the negative input of the first amplifier is to couple to a first output of the CTDAC, the input signal is to couple to the positive input of the first amplifier of the CTB, and the second output of the first amplifier is to couple to a reference input of the CTDAC.

7. The programmable circuit of claim 4, wherein the programmable circuit, in the PGA mode, is configured to perform auto gain control (AGC) to regulate an output signal of the programmable circuit by control of an input code to the CTDAC.

8. The programmable circuit of claim 4, wherein, to perform the gain operation in the PGA mode, an input code supplied to the CTDAC is used to control a gain of the input signal.

9. The programmable circuit of claim 1, wherein the CTB of the programmable circuit comprises:
   a first amplifier coupled to the SH circuit; and
   a second amplifier coupled to the SH circuit.

10. The programmable circuit of claim 1, wherein the CTDAC is a continuous-time voltage digital-to-analog converter (DAC) to output the CTDAC output signal as a voltage signal in a continuous-time domain.

11. The programmable circuit of claim 1, wherein the CTDAC is a resistor-based DAC.

12. An integrated circuit comprising:
    a memory device; and
    a programmable circuit, coupled to the memory device, the programmable circuit configurable to operate in a plurality of modes, the programmable circuit comprising:

a continuous-time digital-to-analog converter (CTDAC);

a continuous-time block (CTB), coupled to the CTDAC; and a sample and hold (SH) circuit coupled to the CTDAC and the CTB, wherein the programmable circuit is configured to operate in a buffered drive mode of the plurality of modes to buffer an output signal from the CTDAC, wherein, in the buffered drive mode, the programmable circuit is further configured to operate in a blanking mode of the plurality of modes to cause the SH circuit to perform a blanking operation on the CTDAC output signal.

13. The system of claim 12, wherein the SH circuit comprises a switch coupled between a first output of the CTDAC and an input of the CTB, wherein, to perform the blanking operation in the blanking mode, the switch of the SH circuit is in an open position to attenuate a glitch on the CTDAC output signal, wherein the glitch results from a code transition of the CTDAC.

14. The system of claim 12, where the programmable circuit is configured to operate in a programmable gain amplifier (PGA) mode to perform a gain operation on an input signal of the programmable circuit.

15. The system of claim 14, wherein the CTB comprises a first amplifier comprising a positive input, a negative input, and a second output, wherein, to perform the gain operation in the PGA mode, the negative input of the first amplifier is to couple to a first output of the CTDAC, the input signal is to couple to the positive input of the first amplifier of the CTB, and the second output of the first amplifier is to couple to a reference input of the CTDAC.

16. The system of claim 14, wherein the programmable circuit, in the PGA mode, is configured to perform auto gain control (AGC) to regulate an output signal of the programmable circuit by control of an input code to the CTDAC.

17. A method comprising:
performing, by a sample and hold (SH) circuit of a programmable circuit, a blanking operation on an output signal of a continuous-time digital-to-analog converter (CTDAC) of the programmable circuit; and subsequent to performing the blanking operation, performing, by a continuous-time block (CTB) of the programmable circuit, a buffering operation to buffer the CTDAC output signal, wherein the programmable circuit is configurable to operate in a plurality of modes, wherein the programmable circuit is configured in a blanking mode of the plurality of modes to perform the blanking operation and configured in a buffered drive mode of the plurality of modes to perform the buffering operation.

18. The method of claim 17, wherein preforming the blanking operation in the blanking mode comprises attenuating a glitch on the CTDAC output signal by closing a switch of the SH circuit.

19. The method of claim 17, further comprising
performing, by the programmable circuit configured in a programmable gain amplifier (PGA) mode, a gain operation on an input signal of the programmable circuit, and wherein the performing the gain operation comprises:
coupling a negative input of a first amplifier of the CTB to a first output of the CTDAC;
coupling the input signal to the positive input of the first amplifier; and
coupling a second output of the first amplifier to a reference input of the CTDAC.

20. The method of claim 19, further comprising
controlling an input code of the CTDAC to regulate an output signal of the programmable circuit for auto gain control (AGC).

* * * * *